(12) United States Patent
Lin et al.

(10) Patent No.: US 8,361,895 B2
(45) Date of Patent: Jan. 29, 2013

(54) ULTRA-SHALLOW JUNCTIONS USING ATOMIC-LAYER DOPING

(75) Inventors: Jing-Cheng Lin, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 283 days.

(21) Appl. No.: 12/211,464

(22) Filed: Sep. 16, 2008

(65) Prior Publication Data

US 2010/0065924 A1 Mar. 18, 2010

(51) Int. Cl.
*H01L 21/22* (2006.01)
*H01L 21/38* (2006.01)

(52) U.S. Cl. ............ 438/558; 438/561; 257/E21.437

(58) Field of Classification Search .......... 438/558, 438/560–561, 529; 257/344, 508, E21.437, 257/E21.433
See application file for complete search history.

(56) References Cited

U.S. PATENT DOCUMENTS

| | | | |
|---|---|---|---|
| 6,114,211 A * | 9/2000 | Fulford et al. | 438/305 |
| 6,521,501 B1 * | 2/2003 | Erhardt et al. | 438/305 |
| 7,118,976 B2 * | 10/2006 | Park | 438/300 |
| 2003/0073318 A1 * | 4/2003 | Sandhu et al. | 438/689 |
| 2006/0030093 A1 * | 2/2006 | Zhang et al. | 438/197 |
| 2006/0115934 A1 * | 6/2006 | Kim et al. | 438/149 |
| 2007/0099388 A1 * | 5/2007 | Jain | 438/301 |
| 2007/0202641 A1 * | 8/2007 | Wei et al. | 438/194 |

OTHER PUBLICATIONS

Cagnat, N., et al., "Ultrathin n+/p Junction in Preamorphized Silicon by Phosphorus and Carbon Coimplantation Engineering: Influence of C Location," Journal of Applied Physics, 102, 106102, 2007, 3 pages, American Institute of Physics.

Cowern, N.E.B., et al., "Mechanisms of B Deactivation Control by F Co-Implantation," Applied Physics Letters, 86, 101905, 2005, 3 pages, American Institute of Physics.

Downey, D.F., et al., "Effect of Fluorine on the Diffusion of Boron in Ion Implanted Si," Applied Physics Letters, vol. 73, No. 9, 1998, pp. 1263-1265, American Institute of Physics.

Pawlak, B.J., et al., "Effect of Amorphization and Carbon Co-Doping on Activation and Diffusion of Boron in Silicon," Applied Physics Letters, 89, 062110, 2006, 3 pages, American Institute of Physics.

Murota, J., et al., "Atomically Controlled Processing for Group IV Semiconductors by Chemical Vapor Depostition," Japanese Journal of Applied Physics, 2006, vol. 45, No. 9A, pp. 6767-6785.

Chiba, Y., et al., "Epitaxial growth of P atomic layer doped Si film by alternate surface reactions of $PH_3$ and $Si_2H_6$ on strained $Si_{1-x}Ge_x$/Si(100) in ultraclean low-pressure CVD," Semiconductor Science and Technology, 2007, vol. 22, pp. S118-S122.

Sato, T., et al., "Dominant Factor for the Concentration of Phosphorus Introduced by Vapor Phase Doping (VPD)," Japanese Journal of Applied Physics, Mar. 1998, vol. 37, Part 1, No. 3B, pp. 1162-1165.

\* cited by examiner

*Primary Examiner* — Matthew Landau
*Assistant Examiner* — Daniel Luke
(74) *Attorney, Agent, or Firm* — Slater & Matsil, L.L.P.

(57) ABSTRACT

A semiconductor device and a method of manufacturing are provided. A substrate has a gate stack formed thereon. Ultra-shallow junctions are formed by depositing an atomic layer of a dopant and performing an anneal to diffuse the dopant into the substrate on opposing sides of the gate stack. The substrate may be recessed prior to forming the atomic layer and the recess may be filled by an epitaxial process. The depositing, annealing, and, if used, epitaxial growth may be repeated a plurality of times to achieve the desired junctions. Source/drain regions are also provided on opposing sides of the gate stack.

22 Claims, 15 Drawing Sheets

ULTRA-SHALLOW JUNCTIONS USING ATOMIC-LAYER DOPING

TECHNICAL FIELD

The present invention relates generally to semiconductor devices and, more particularly, to semiconductor devices having ultra-shallow junctions formed using an atomic-layer doping processes.

BACKGROUND

Complementary metal oxide semiconductor (CMOS) devices, such as metal oxide semiconductor field-effect transistors (MOSFETs), are commonly used in the fabrication of ultra-large scale integrated (ULSI) devices. The continuing trend is to reduce the size of the devices and to lower the power consumption requirements. Size reduction of the MOSFETs has enabled the continued improvement in speed, performance, density, and cost per unit function of integrated circuits. Significant challenges, however, are faced as the size of CMOS devices continue to decrease.

For example, as the length of the gate electrode of a MOSFET is reduced, the source and drain regions increasingly interact with the channel and gain influence on the channel potential and the gate dielectric. Consequently, a transistor with a short gate length suffers from problems related to the inability of the gate electrode to substantially control the on and off states of the channel. Phenomena such as reduced gate control associated with transistors with short channel lengths are termed short-channel effects.

One method of reducing the influence of the source and drain on the channel and the gate dielectric is to use graded junctions. Graded junctions are formed by performing multiple ion implants in the source and drain regions. Generally, the area of the source and drain regions adjacent to the gate electrode is lightly doped, and the area of the source and drain regions farther away from the gate electrodes is doped heavier.

Shallow lightly-doped areas have been fabricated by lowering the implant energy and increasing the dose or ion concentration. Because the implant energy is lowered, the depth of the implant region is small, and because the dose or ion concentration is increased, the areas are less resistive. As a result, a shallow area having low electrical resistance is created. This method, however, may exhibit degraded activation and anomalous enhancement in the diffusion.

Accordingly, what is needed in the art is improved source/drain regions.

SUMMARY OF THE INVENTION

These and other problems are generally reduced, solved or circumvented, and technical advantages are generally achieved, by embodiments of the present invention, which provides MOSFETs with ultra-shallow junctions.

In accordance with an embodiment of the present invention, a method of forming a semiconductor device is provided. A substrate is provided having a gate stack formed thereon. Heavily-doped source/drain regions are formed, and an atomic layer of a dopant is formed on the surface of the substrate in the drain extension regions. An annealing process is performed to diffuse the atomic layer into the substrate.

In accordance with another embodiment of the present invention, a method of forming a semiconductor is provided. A substrate having a gate stack is provided. Recesses are formed in the substrate on opposing sides of the gate stack. An atomic layer of a dopant is formed along the surface of the recesses, and an anneal is performed. An epitaxial process may be used to form an epitaxial layer in the recess. Source/drain regions may also be formed such that the recesses extend closer to the gate stack than to the source/drain regions.

In accordance with another embodiment of the present invention, a semiconductor device is provided. The semiconductor device includes a substrate with a gate stack formed thereon. Ultra-shallow junctions are positioned in recesses in the substrate on opposing sides of the gate stack. Source/drain regions are positioned on opposing sides of the gate stack.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
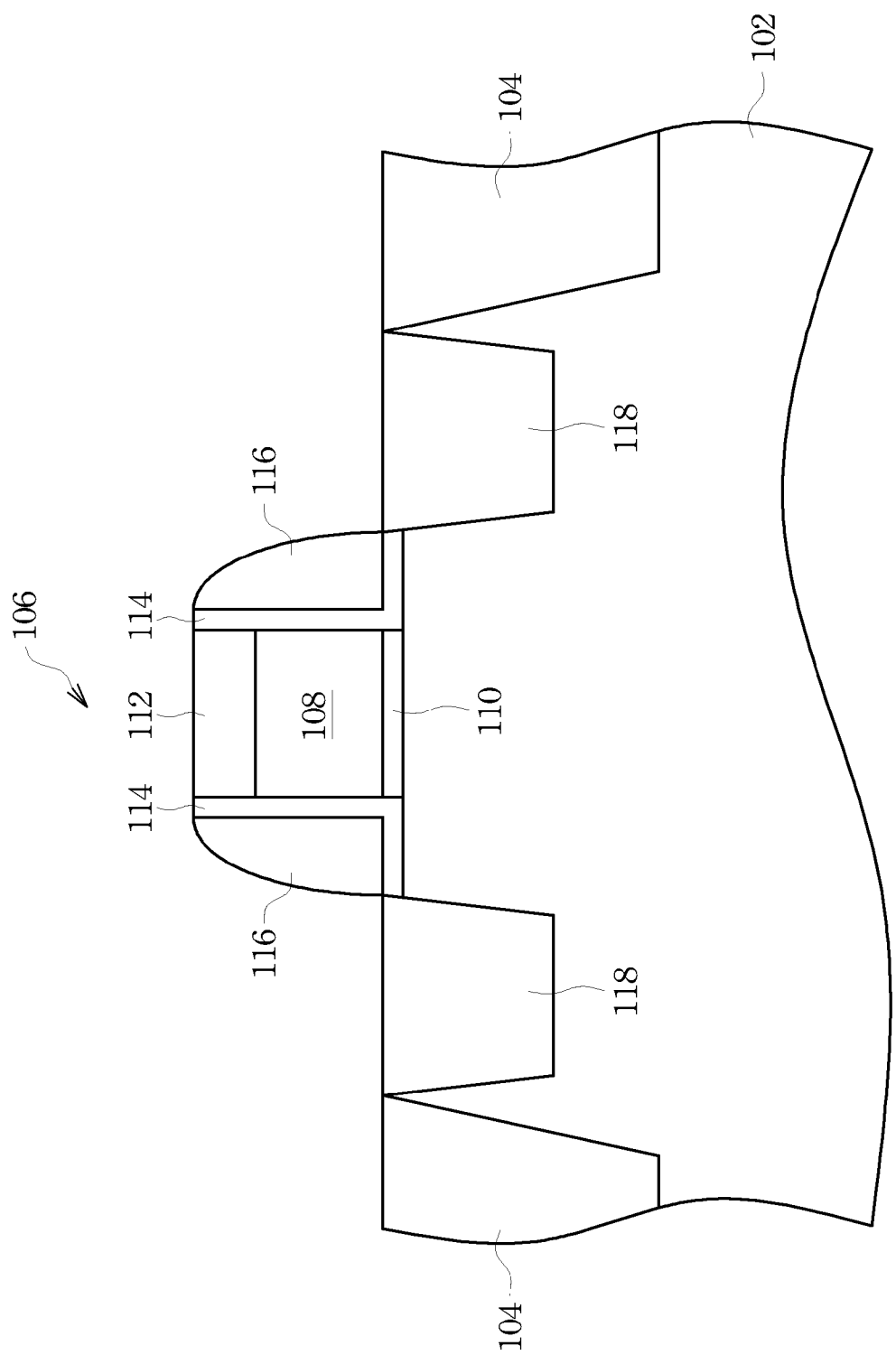
FIGS. 1-6 illustrate various intermediate process steps of a method of forming a semiconductor device.

Referring first to FIGS. 1-7, there is illustrated a first method of forming a transistor having ultra-shallow junctions (USJs) in accordance with an embodiment of the present invention. Referring first to FIG. 1, there is shown a substrate 102 having isolation structures 104 formed therein to define an active region in the substrate 102. The substrate 102 is preferably a silicon substrate, though other materials, such as germanium, quartz, sapphire, and glass, could alternatively be used. Alternatively, the silicon substrate 102 may be an active layer of a semiconductor-on-insulator (SOI) substrate or a multi-layered structure such as a silicon-germanium layer formed on a bulk silicon layer.

The isolation structures 104 may be formed using standard shallow trench isolation processes, for example, comprising the steps of etching trenches with depths in the range of about 2,000 Å to about 6,000 Å and filling the trenches with a dielectric material by chemical vapor deposition. The dielectric material may be silicon oxide, for example. Other types of isolation structures, such as field oxide regions, may also be used. Ion implantation may be performed to create n-type and/or p-type well regions (not shown) in the substrate 102 between the isolation structures 104.

Also shown in FIG. 1 is a gate stack 106. The gate stack 106 comprises a gate electrode 108 overlying a gate dielectric 110. The gate stack 106 may additionally comprise a gate mask 112 overlying the gate electrode 108 to protect the gate electrode 108 during subsequent processing steps.

Generally, the gate stack 106 may be formed by sequentially depositing conformal layers of a gate dielectric material, a gate electrode material, and a gate mask material, and subsequently patterning the layers to form the gate stack 106 as illustrated in FIG. 1. The layer of gate dielectric material may be formed using any gate dielectric formation process known and used in the art, e.g., thermal oxidation, nitridation, sputter deposition, or chemical vapor deposition. In an embodiment, the layer of gate dielectric material may be formed of silicon oxide, silicon oxynitride, a high permittivity (high-k) gate dielectric, combinations thereof, or the like and have a thickness in the range of about 5 Å to about 100 Å. Suitable high-k dielectric materials include aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthanum oxide ($La_2O_3$), cerium oxide $CeO_2$), titanium oxide ($TiO_2$), and tantalum oxide ($Ta_2O_5$). Other materials, processes, and thicknesses may be used.

After the layer of gate dielectric material is formed, a layer of gate electrode material is formed. The layer of gate electrode material can be one or more layers of poly-crystalline silicon, poly-crystalline silicon germanium, metals, metallic silicides, metallic nitrides, or a conductive metallic oxide, and may be deposited by conventional techniques such as chemical vapor deposition.

A layer of gate mask material may then optionally be formed over the layer of gate electrode material. The subsequent processing steps, including implanting, etching, and the like, may damage the gate electrode 108. To prevent this damage, it may be desirable to form the gate mask 112 over the gate electrode 108. The layer of gate mask material may be formed using any suitable masking materials such as silicon oxide, silicon oxynitride, silicon nitride, or the like. The layer of gate mask material may alternatively be a multi-layer structure, such as a layer of silicon oxide and a layer of silicon nitride.

The layers of the gate dielectric material, gate electrode material, and gate mask material may then be patterned using standard photolithography techniques known in the art, thereby forming the gate stack 106 as illustrated in FIG. 1. Generally, photolithography involves depositing a photoresist material, which is then masked, exposed, and developed. After the photoresist material is patterned, an etching process may be performed to remove unwanted portions of the layers of the gate dielectric material, the gate electrode material, and the gate mask material to form the gate dielectric 110, the gate electrode 108, and the gate mask 112, respectively, as illustrated in FIG. 1. In an embodiment in which the gate electrode 108 is formed of poly-silicon and the gate dielectric 110 is formed of silicon oxide, the etching process may be a wet or dry, anisotropic or isotropic, etch process, but preferably is an anisotropic dry etch process.

Also shown in FIG. 1 are liners 114 and spacers 116. The liners 114 are preferably a substantially conformal oxide layer. As will be described in greater detail below, the liners 114 protect the sidewalls of the gate electrode 108 and gate dielectric 110 from subsequent processing steps, particularly from implant processes. In an embodiment, the liners 114 comprise an oxide layer, a nitrogen-containing layer, or the like, such as silicon dioxide, silicon nitride, silicon oxynitride, or silicon oxide, or the like, formed by chemical vapor deposition, low-pressure CVD (LPCVD), or the like. In the preferred embodiment, the liners 114 are between 20 Å to about 100 Å in thickness. It should be noted, however, that the thickness of the liners 114 define location of the USJs and the (optional) pocket implants as described in greater detail below. Accordingly, the thickness of the liners 114 may be adjusted to position the USJs and the optional pocket implants at the desired locations.

The spacers 116, which act as masks for forming source/drain regions in subsequent processing steps, preferably comprise a nitrogen-containing layer, such as silicon nitride, silicon oxynitride, silicon oxime, a combination thereof, or the like. In a preferred embodiment, the spacers 116 are formed from a layer comprising silicon nitride that has been formed using chemical vapor deposition techniques using silane and ammonia ($NH_3$) as precursor gases. Other materials and processes may be used. However, it should be noted that it is preferred that a high-etch selectivity exists between the material used to form the liners 114 and the spacers 116.

The spacers 116 may be patterned by performing a plasma etch using, for example, $CF_4$, $SF_6$, $NF_3$, or the like. Because the thickness of the layer of silicon nitride (or other material) is greater in the regions adjacent to the gate stack 106, the plasma etch removes the silicon nitride material except for that material adjacent the gate stack 106, thereby forming the spacers 116 as illustrated in FIG. 1.

Thereafter, the exposed portions of the liners 114 may be removed, wherein the spacers 116 act as a mask for the removal process. The exposed portions of the liners 114 may be removed by a plasma etch using, for example, $CF_4$, $SF_6$, $NF_3$, or the like.

The liners 114 and the spacers 116 act as an alignment mask for creating source/drain regions 118. The source/drain regions 118 may be any source/drain structure suitable for particular purpose and design of the semiconductor device. For example, the source/drain regions 118 may be formed by implanting ions of the appropriate conductivity type wherein the liners 114 and the spacers 116 act as implant masks. In another example, the source/drain regions 118 may comprise stressors. In this example, recesses may be etched into the substrate 102 and a material having a different lattice structure than the substrate 102 may be epitaxially grown in the recesses, thereby imparting a stress in the channel region.

It has been found that imparting a tensile stress in the source-to-drain direction of the channel region of an NMOSFET increases electron mobility and imparting a compressive stress in the source-to-drain direction of the channel region of a PMOSFET increases hole mobility. Preferably, the source/drain regions 118 comprise SiC when fabricating an NMOSFET and SiGe when fabricating a PMOSFET. The source/drain regions 118 may be doped using implant or using in situ techniques, but preferably, the source/drain regions 118 are doped in situ to avoid damage caused by the implant processes. The source/drain regions 118 may also include raised source/drain regions.

It should be noted that the above discussion provides an illustrative example of an embodiment of the present invention. Other embodiments may use different processes, materials, and the like. Furthermore, the sequence of steps as well as the structures themselves may be varied. For example, the source/drain regions may be formed before the gate stack, additional/fewer liners and spacers may be used, different source/drain regions may be used, and/or the like.

Figure 2:
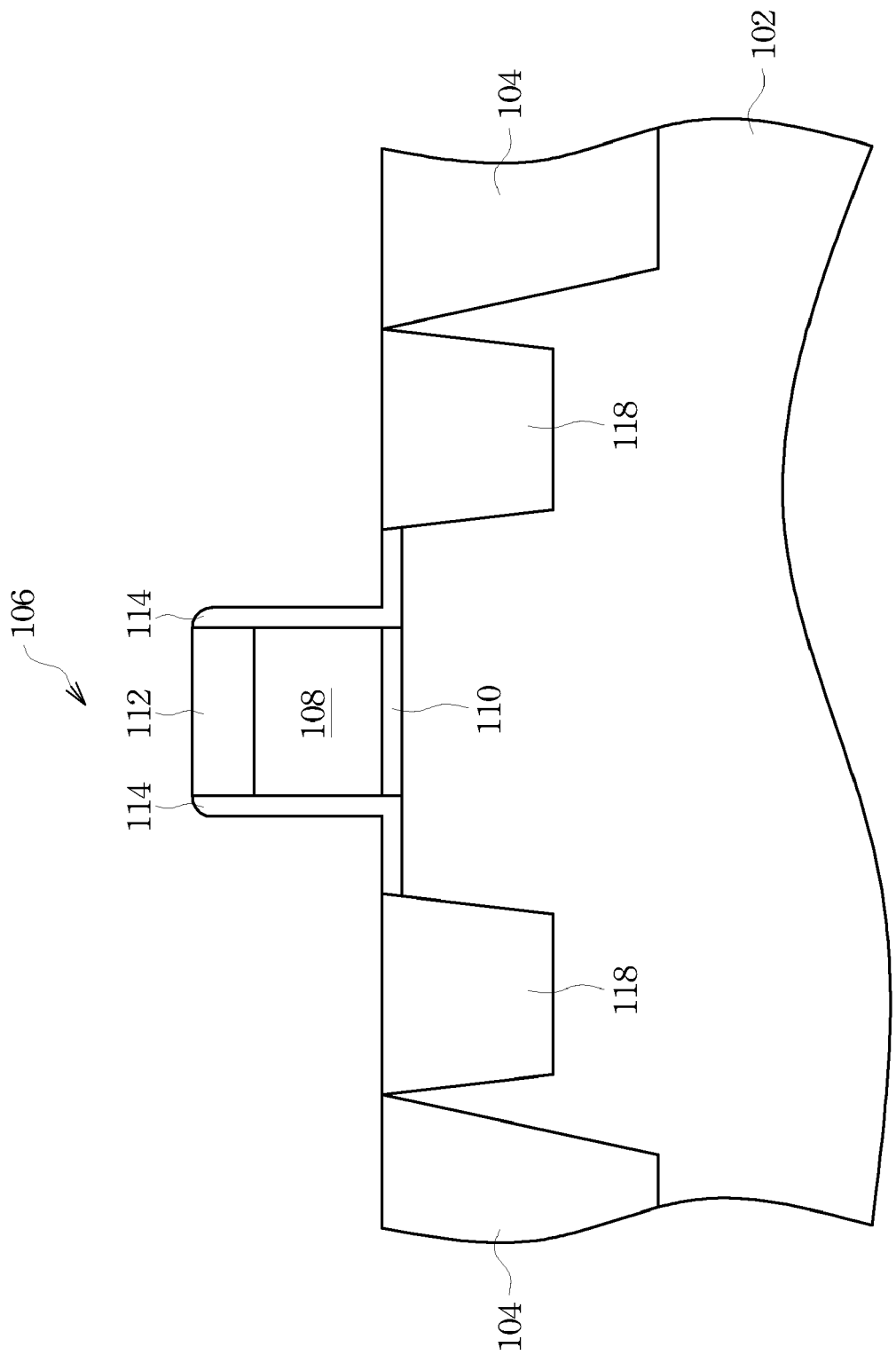

Referring now to FIG. 2, the removal of the spacers 116 is shown in accordance with an embodiment of the present invention. After the source/drain regions 118 are formed, the spacers 116 are removed in preparation of forming the USJs. The spacers 116 may be removed using phosphoric acid.

Optionally, pocket implants (not shown) may also be formed. Pocket implants are preferably formed by implanting ions having an opposite type of conductivity as the source/drain regions. Thus, when forming an NMOSFET, p-type impurities such as boron ions may be implanted, and when forming a PMOSFET, n-type impurities such as arsenic ions may be implanted. Other p-type impurities, such as boron difluoride, aluminum, gallium, indium, or the like, and other n-type impurities, such as phosphorous, antimony, or the like, may also be used.

It should be noted that the gate stack 106 and the liners 114 adjacent the gate stack 106 act as an implant mask for the ion implant process to form the pocket implant regions. One skilled in the art will appreciate that the depth and the lateral dimensions of the pocket implant regions may be controlled by the implant angle (e.g., implanting at an angle normal, oblique, or the like to the surface of the substrate 102), the dose, and the energy level of the implant. Furthermore, additional masks (not shown) may be used to control the width of the pocket implant regions and the distance the pocket implant regions extend away from the gate stack 106. Thus, the dimensions and the density of the pocket implant regions may be customized for a particular application and for a particular gate length, and may be customized to extend below the gate stack 106. An anneal process may be performed after the pocket implant regions have been formed to activate and laterally diffuse the implanted ions.

Figure 3:
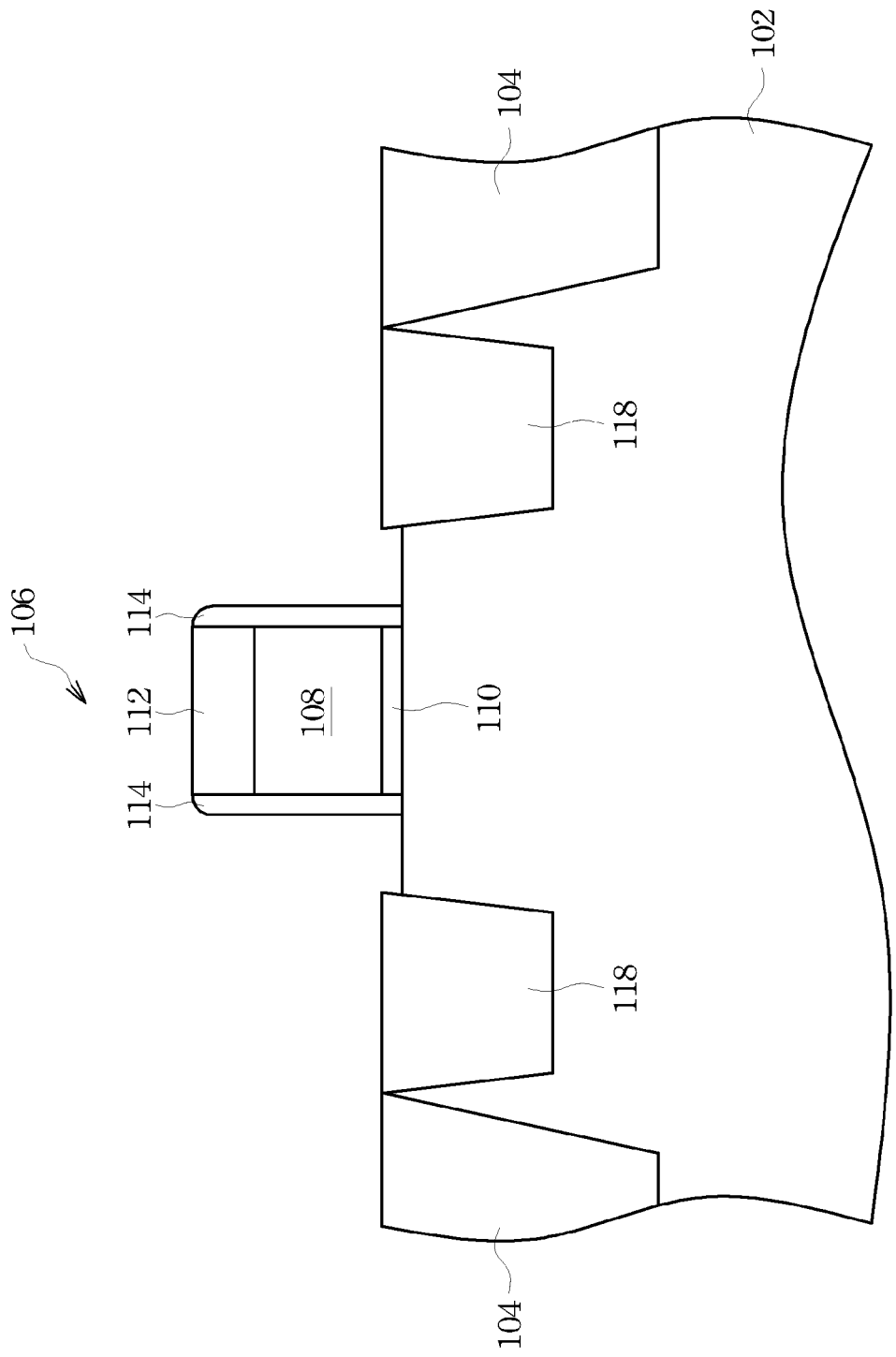

FIG. 3 illustrates the removal of a portion of the liners 114 in accordance with an embodiment of the present invention. In particular, a portion of the liners 114 extending along the top surface of the substrate 102 between the gate stack 106 and the source/drain regions 118 is removed, thereby exposing the substrate, but leaving the liners 114 on the sidewalls of the gate stack 106. The removal of a portion of the liners 114 may be performed using photolithographic processes, in which a mask (not shown) is deposited and patterned to protect the desired portions of the liners 114 and then performing an etch process to remove exposed portions of the liners 114, thereby patterning the liners 114 as illustrated in FIG. 3. Other processes and techniques may also be used.

Figure 4:
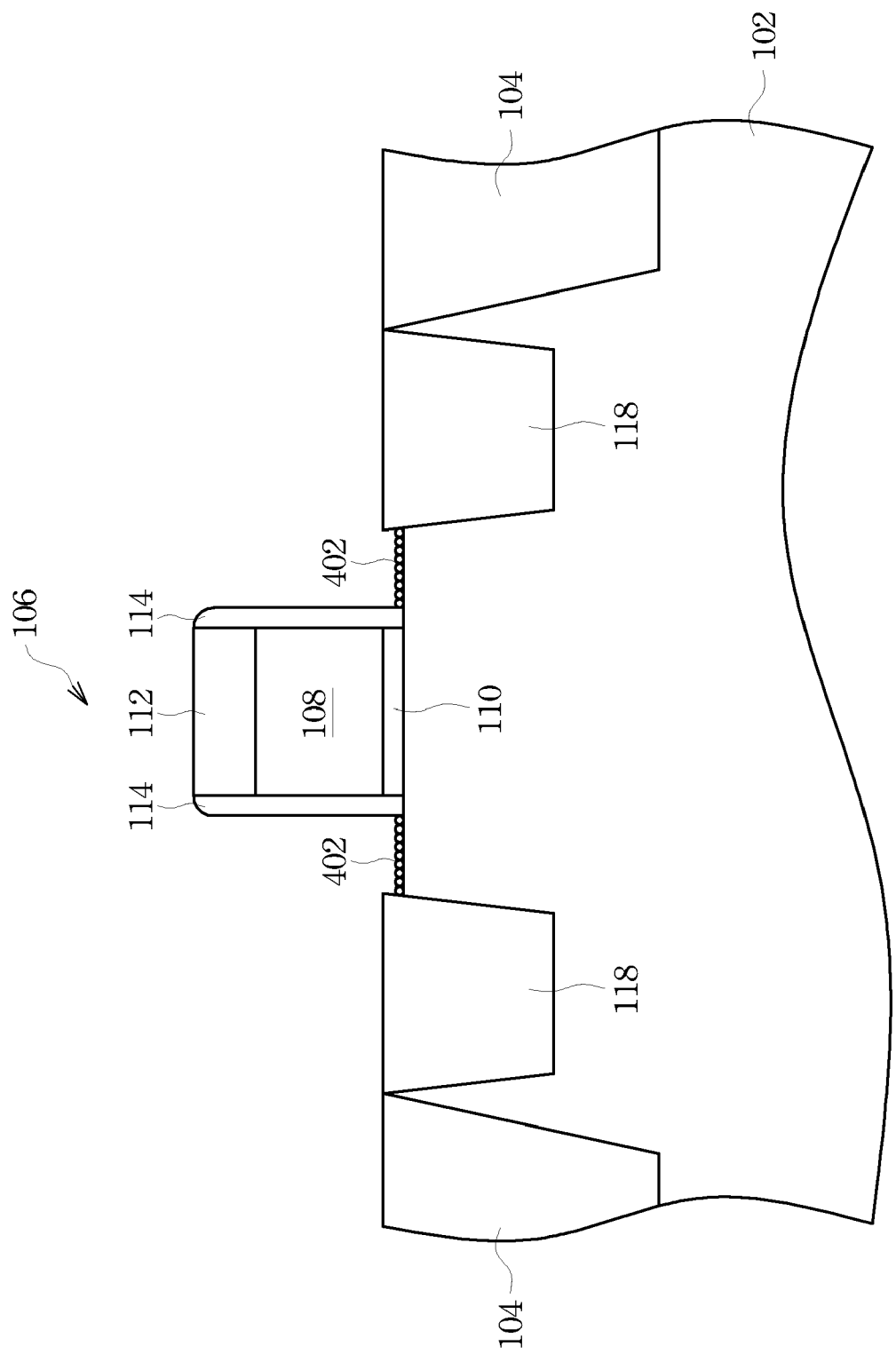

Thereafter, as illustrated in FIG. 4, an atomic layer 402 is formed on the exposed portions of the substrate 102 in accordance with an embodiment of the present invention. Preferably, a selective atomic layer dopant growth process is utilized. In an embodiment in which an NMOSFET is being formed, an atomic layer of n-type atoms, may be formed using a reaction chamber at atmospheric or reduced pressure with a carrier gas such as $H_2/N_2$, $N_2/He$, $H_2/He$, or the like and a precursor of $PH_3$, $AsH_3$, or the like at a temperature between about 200° C. to about 600° C.

In an embodiment in which a PMOSFET is being formed, an atomic layer of p-type atoms, may be formed using a reaction chamber at atmospheric or reduced pressure with a carrier gas such as $H_2/N_2$, $N_2/He$, $H_2/He$, or the like and a precursor of $B_2H_6$ or the like at a temperature of between about 200° C. to about 600° C.

Figure 5:
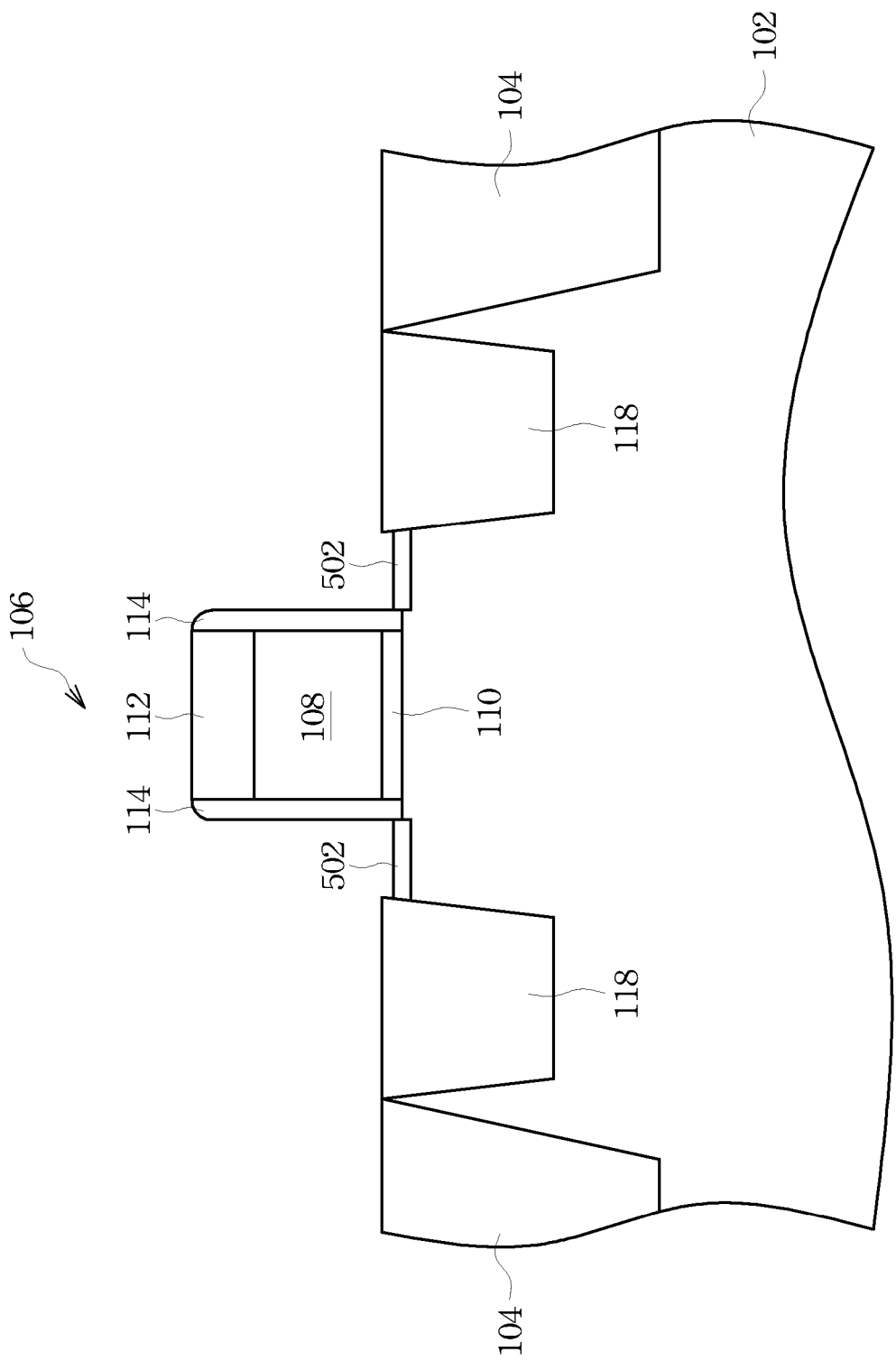

FIG. 5 illustrates the diffusion of the atomic layer 402 (see FIG. 4) into the substrate 102, thereby forming USJs 502 in accordance with an embodiment of the present invention. The anneal may be a rapid thermal anneal (RTA), a spike anneal, a laser anneal, a flash anneal, or the like. In an embodiment, an anneal is performed at a temperature between about 1000° C. and about 1350° C. for a duration ranging from 0.001 seconds to about 30 seconds.

The process described above may be performed as either a selective or a non-selective process. In a selective atomic layer doping procedure, the atoms grow on exposed portions of the substrate 102, leaving the other surfaces relatively free of the atomic layer. This may be achieved by introducing another gas, such as HCl, that acts to prohibit or reduce the atomic growth on surfaces other than the substrate 102.

Optionally, however, a non-selective atomic layer growth process may be used in which HCl is not used. In this embodiment, it may be desirable to form and pattern a protective layer over the substrate 102 and the structures formed thereon such that only the substrate 102 between the liner 114 alongside the gate stack 106 and the source/drain regions 118 are exposed. One such protective layer is silicon nitride, on which it is difficult for the atomic layer 402 to form. After the USJs 502 are formed, the protective layer may be removed.

It should also be noted that the processes described above with reference to FIGS. 4 and 5 may be repeated multiple times in order to increase the dopant concentration in the USJs 502. Preferably, the USJs 502 extend under the liner 114 to be aligned with or extending under the gate stack 106.

It should be appreciated that the use of atomic layer doping processes such as those described above are self-limited. As a result, the process and the doping levels may be atomically controlled. Furthermore, the above-described process allows the growth process to be separated from the absorption or doping process. It should be noted, however, that the self-limiting aspect may be dependent upon the temperature and pressure of the dopant gas. Generally, p-type dopant deposition is self-limited at low temperatures, while n-type dopant deposition is self-limited at a wider range of temperatures.

Figure 6:
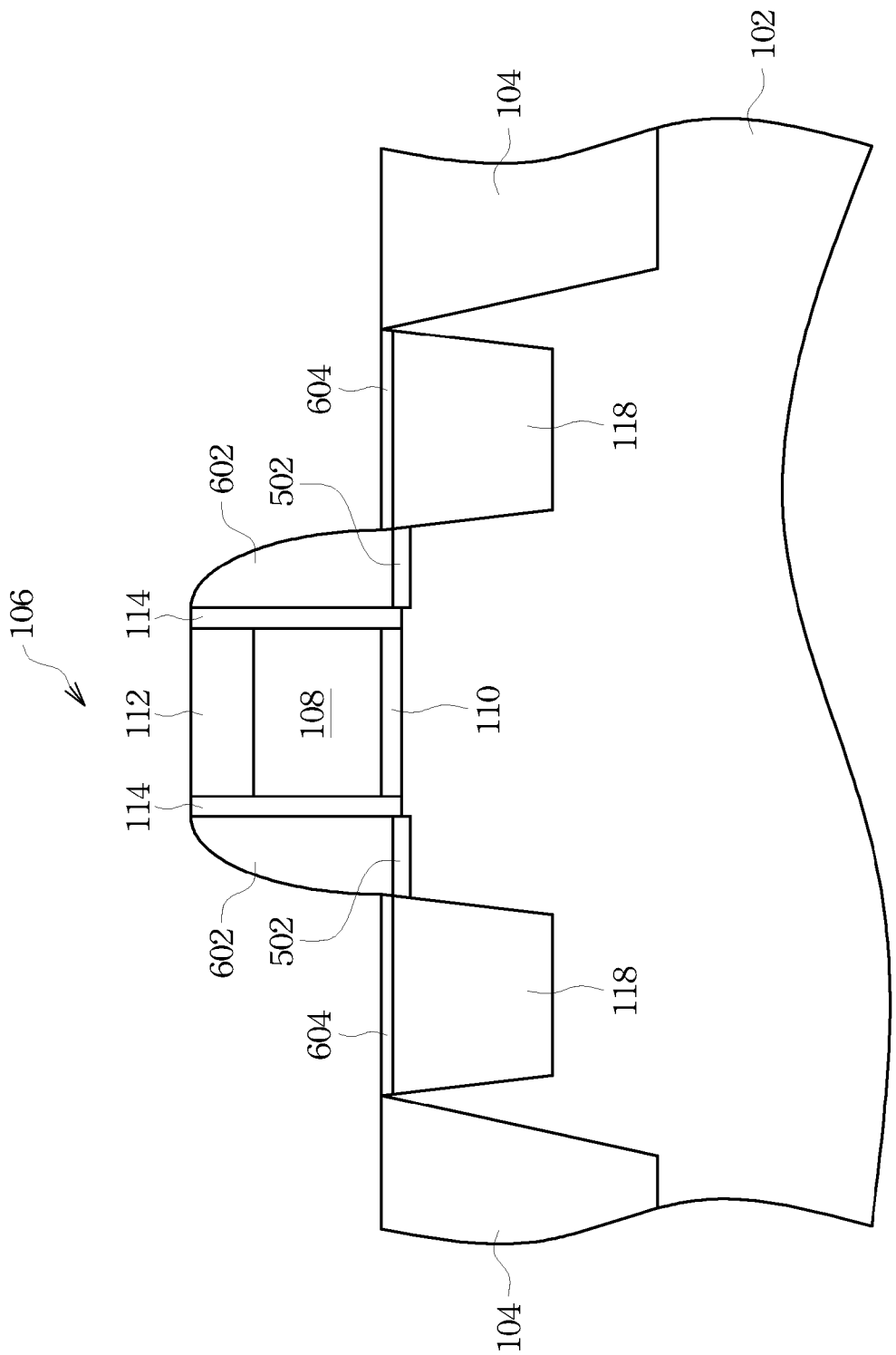

FIG. 6 illustrates the formation of second spacers 602 and silicide regions 604 in accordance with an embodiment of the present invention. The silicidation process may be used to decrease the contact resistance between contact plugs (not shown) and source/drain regions. The silicide regions 604 may be formed by depositing a metal layer such as a nickel-based layer via plasma vapor deposition (PVD) procedures. An anneal procedure causes the metal layer to react with the source/drain regions to form a metal silicide, e.g., nickel silicide. Portions of the metal layer overlying the second spacers 602 and the gate mask 112 remain unreacted. Selective removal of the unreacted portions of the metal layer may be accomplished, for example, by wet etch procedures. An additional anneal cycle may be used if desired to alter the phase of silicide regions, which may result in a lower resistance. The second spacers 602 may be formed using similar processes and materials as the first spacers 116 discussed above with reference to FIG. 1. Optionally, the liner 114 may be reformed on the surface of the substrate 102 prior to forming the second spacers 602. Silicide regions may also be formed on the gate electrode 108 by removing the gate mask 112 prior to forming the silicide regions.

Thereafter, standard processing techniques may be used to complete fabrication of the semiconductor device. For example, stress layers may be formed, inter-layer dielectrics may be formed, contacts and vias may be formed, metal lines may be fabricated, and the like.

Figure 7:
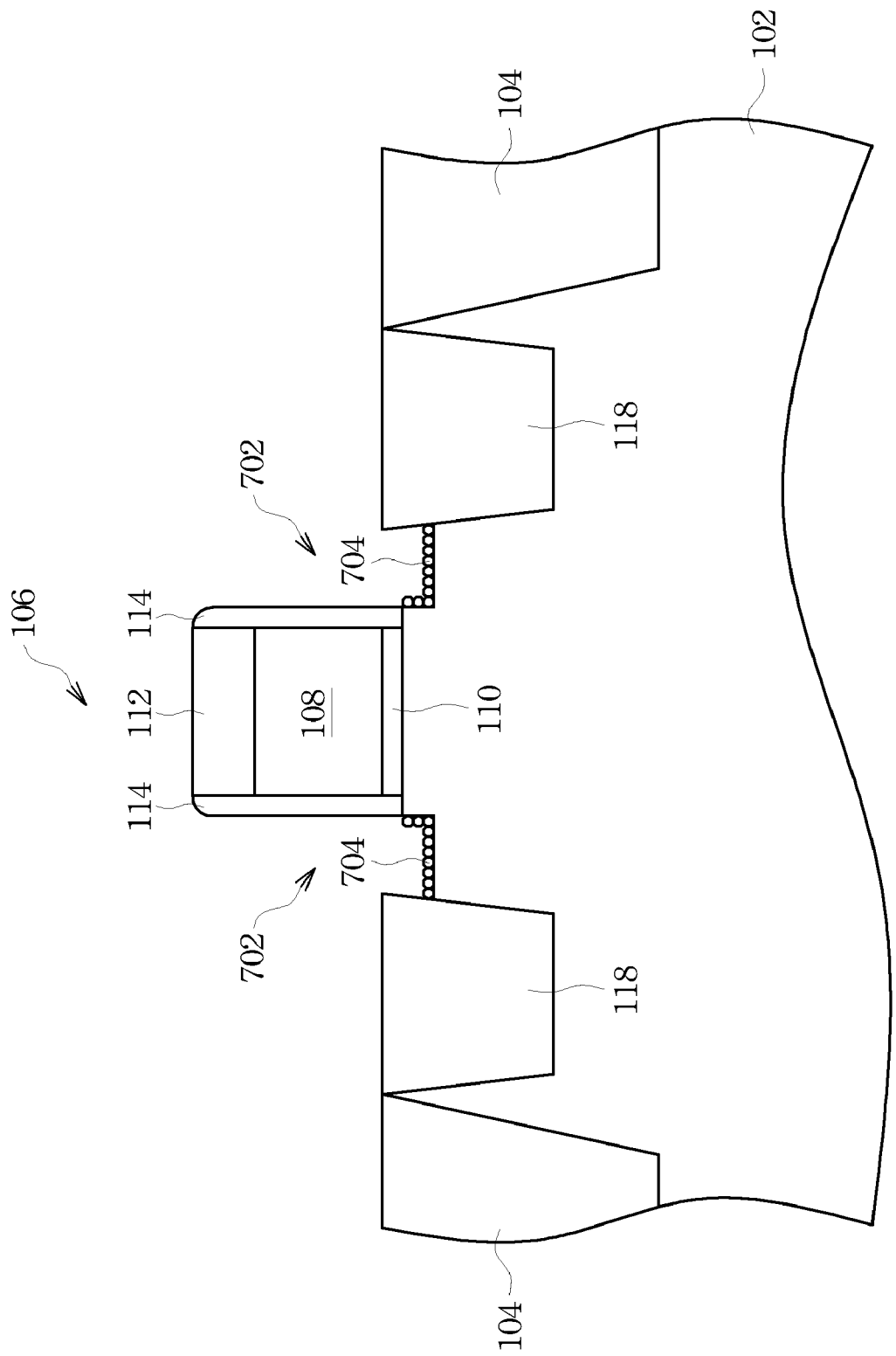
FIGS. 7-9 illustrate various intermediate process steps of another method of forming a semiconductor device.
Figure 8:
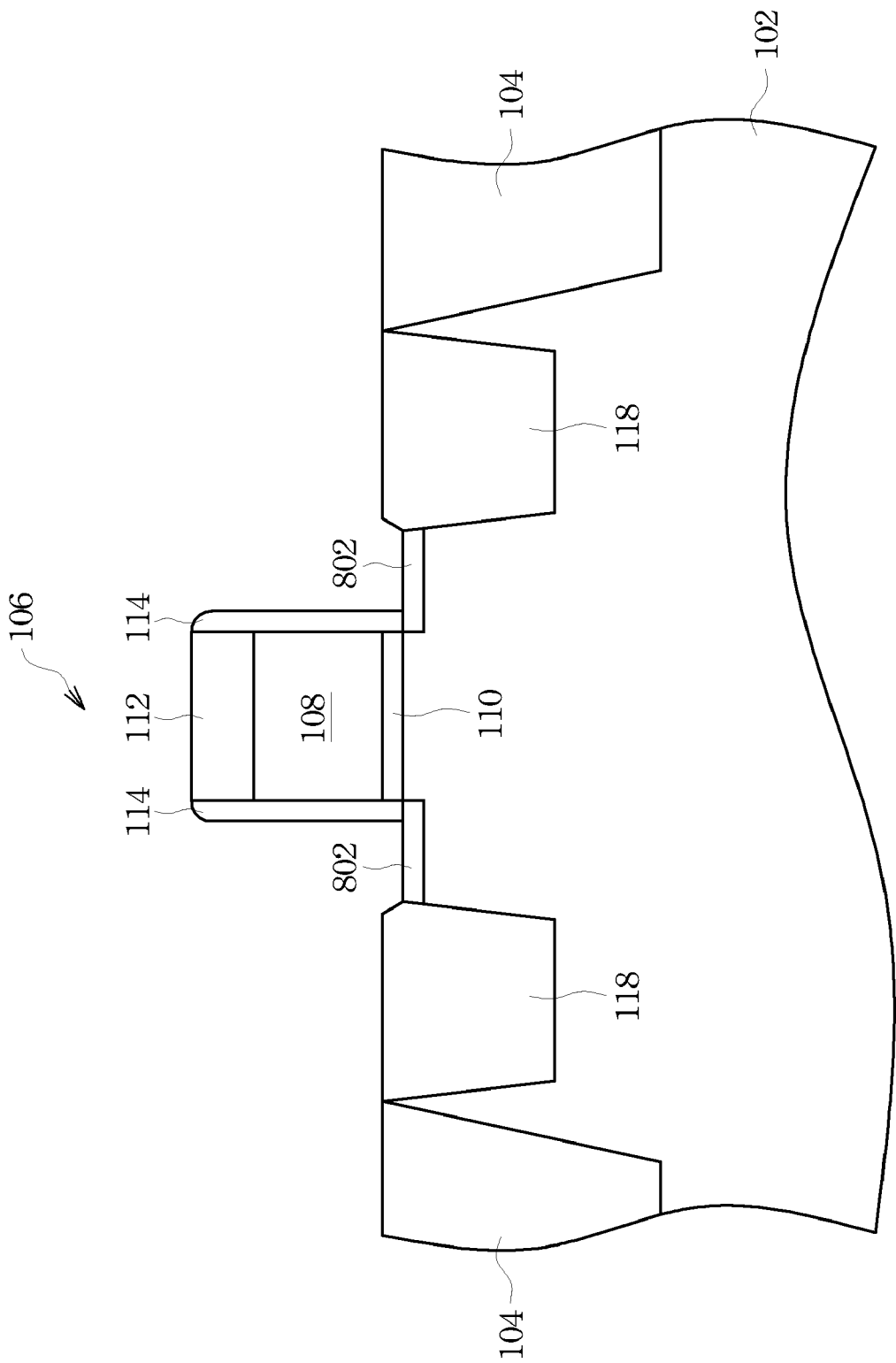
Figure 9:
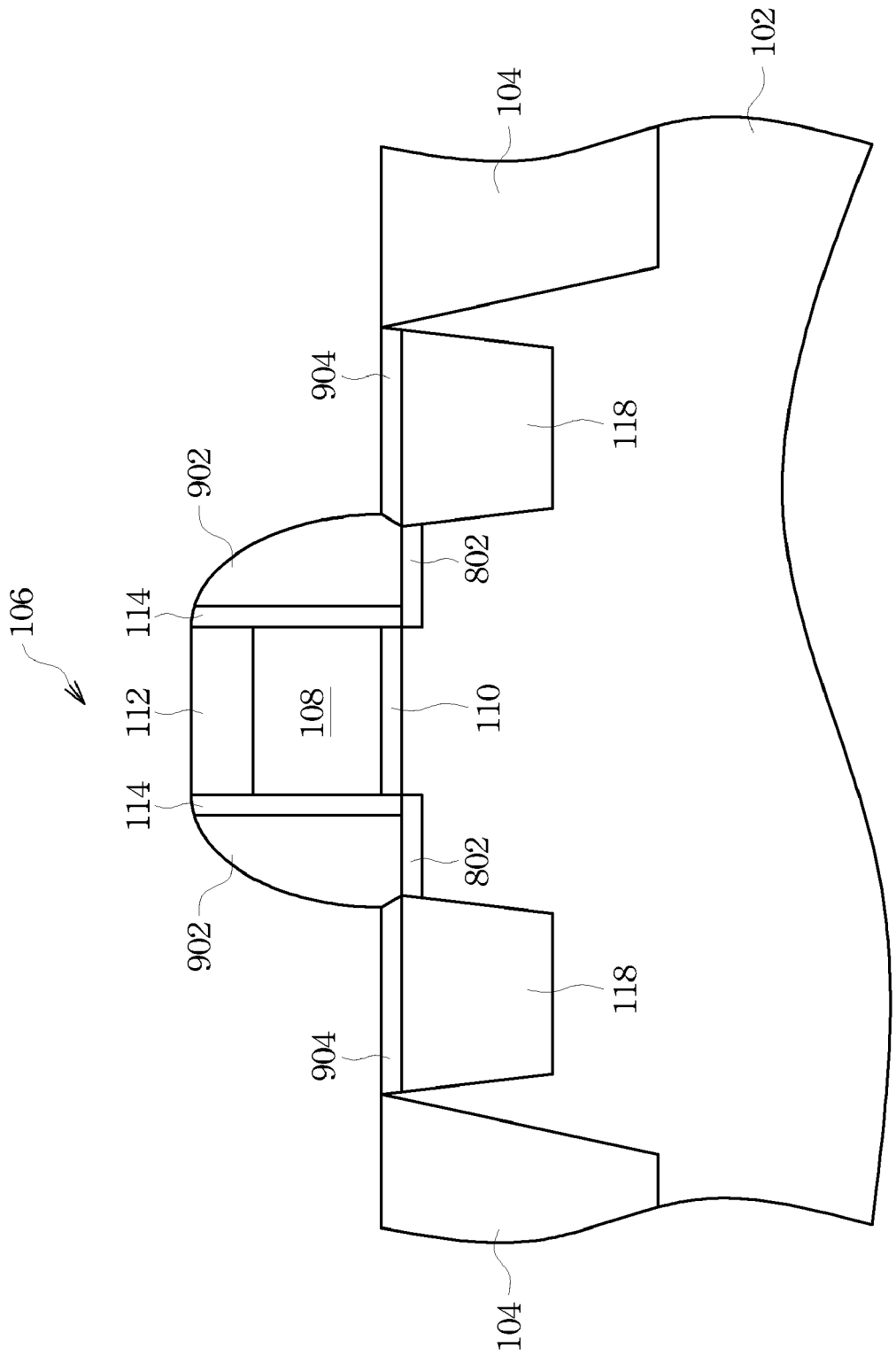

FIGS. 7-9 illustrate another method of forming a transistor having ultra-shallow junctions in accordance with an embodiment of the present invention. FIGS. 7-9 assume a starting structure similar to that described above with reference to FIGS. 1-4, wherein like reference numerals refer to like elements, although other structures may be used. Accordingly, the method of this embodiment is illustrated by the processes discussed above with reference to FIGS. 1-3 followed by the processes described below with reference to FIGS. 7-9.

Referring now to FIG. 7, recesses 702 are formed in the exposed portions of the substrate 102 and an atomic layer 704 are formed therein. Due to the monolayer of atoms used in the atomic layer doping process, the amount of diffusion into the source/drain extensions may be limited, particularly in the lateral direction. In embodiments in which a greater lateral diffusion is desired, recesses 702 may be formed as illustrated. In this embodiment, the atomic layer 704 is formed along the vertical and horizontal surfaces of the recesses 702. This increases the surface area for the atomic layer doping process, but also provides atoms for direct lateral diffusion toward the gate stack 106.

The recesses 702 may be formed, for example, by dry etch processes (e.g., inductively-coupled plasma (ICP) etching, reactive ion etching (RIE), and the like) and/or wet etch processes (e.g., chemical etching, photo-enhance chemical etching, and the like). It may be desirable to form a mask prior to etching to protect the other structures formed on the substrate. Preferably, the recesses 702 have a depth between about 1 nm to about 15 nm.

The atomic layer 704 may be formed using similar materials and processes as discussed above with reference to the atomic layer 402 of FIG. 4.

FIG. 8 illustrates the diffusion of the atomic layer 704 (see FIG. 7) into the substrate 102 and the growth of an epitaxial layer within the recesses 702 (see FIG. 7), thereby forming USJs 802 in accordance with an embodiment of the present invention. The anneal may be a rapid thermal anneal (RTA), a spike anneal, a laser anneal, a flash anneal, or the like. In an embodiment, an anneal is performed at a temperature between about 1000° C. and about 1350° C. for a duration ranging from 0.001 seconds to about 30 seconds.

Following the anneal, an epitaxial growth process is performed to form the epitaxial layer. In an embodiment in which a silicon substrate is used, the epitaxial growth process may comprise an epitaxial growth process such as chemical vapor deposition (CVD), ultra-high vacuum chemical vapor deposition (UHV-CVD), molecular beam epitaxy, or the like may be used to grow a silicon layer. Optionally, the epitaxial layer may be in situ doped with additional ions of the proper conductivity (e.g., boron ions for PMOSFETs and phosphorous ions for NMOSFETs) to provide more ions in the USJ extensions 802. The epitaxial growth may include a material the same as or different than the substrate. Different materials may be used, for example, to introduce additional stress, tensile or compressive, in the channel region.

The atomic layer doping, anneal, and epitaxy processes may be repeated multiple times in order to increase the dopant concentration in the USJs 802. Preferably, the USJs 802 extend under the liner 114 to be aligned with or extend under the gate stack 106.

Thereafter, as illustrated in FIG. 9, second spacers 902 and silicide regions 904 may be formed in accordance with an embodiment of the present invention. The second spacers 902 and the silicide regions 904 may be formed using similar processes and materials as discussed above with reference to the second spacers 602 and silicide regions 604 of FIG. 6. Optionally, the liner 114 may be reformed on the surface of the substrate 102 prior to forming the second spacers 602. Standard processing techniques may be used to complete fabrication of the semiconductor device. For example, the source/drain regions and the gate electrode may be silicided, stress layers may be formed, inter-layer dielectrics may be formed, contacts and vias may be formed, metal lines may be fabricated, and the like.

Figure 10:
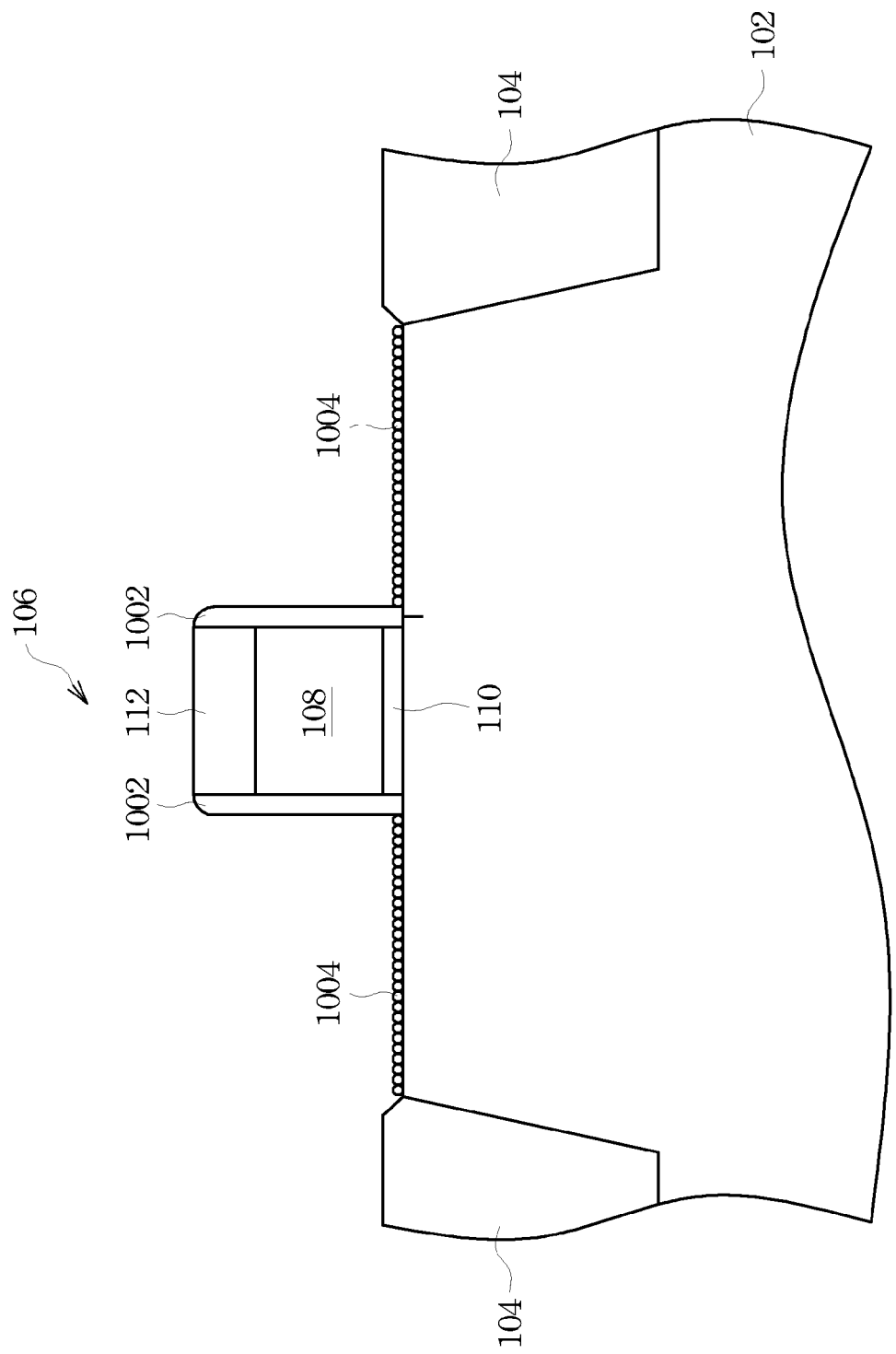
FIGS. 10-12 illustrate various intermediate process steps of yet another method of forming a semiconductor device.
Figure 11:
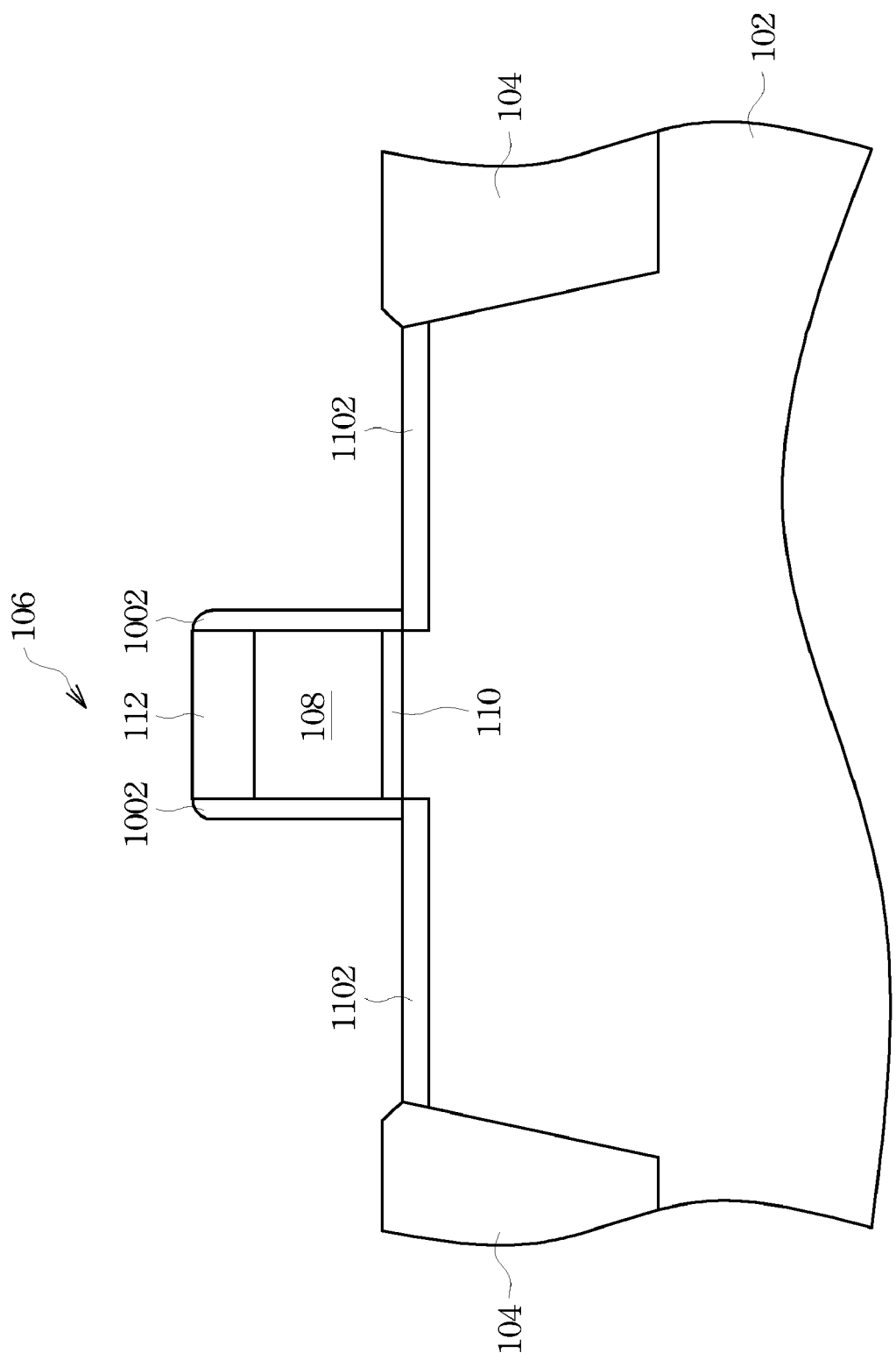
Figure 12:
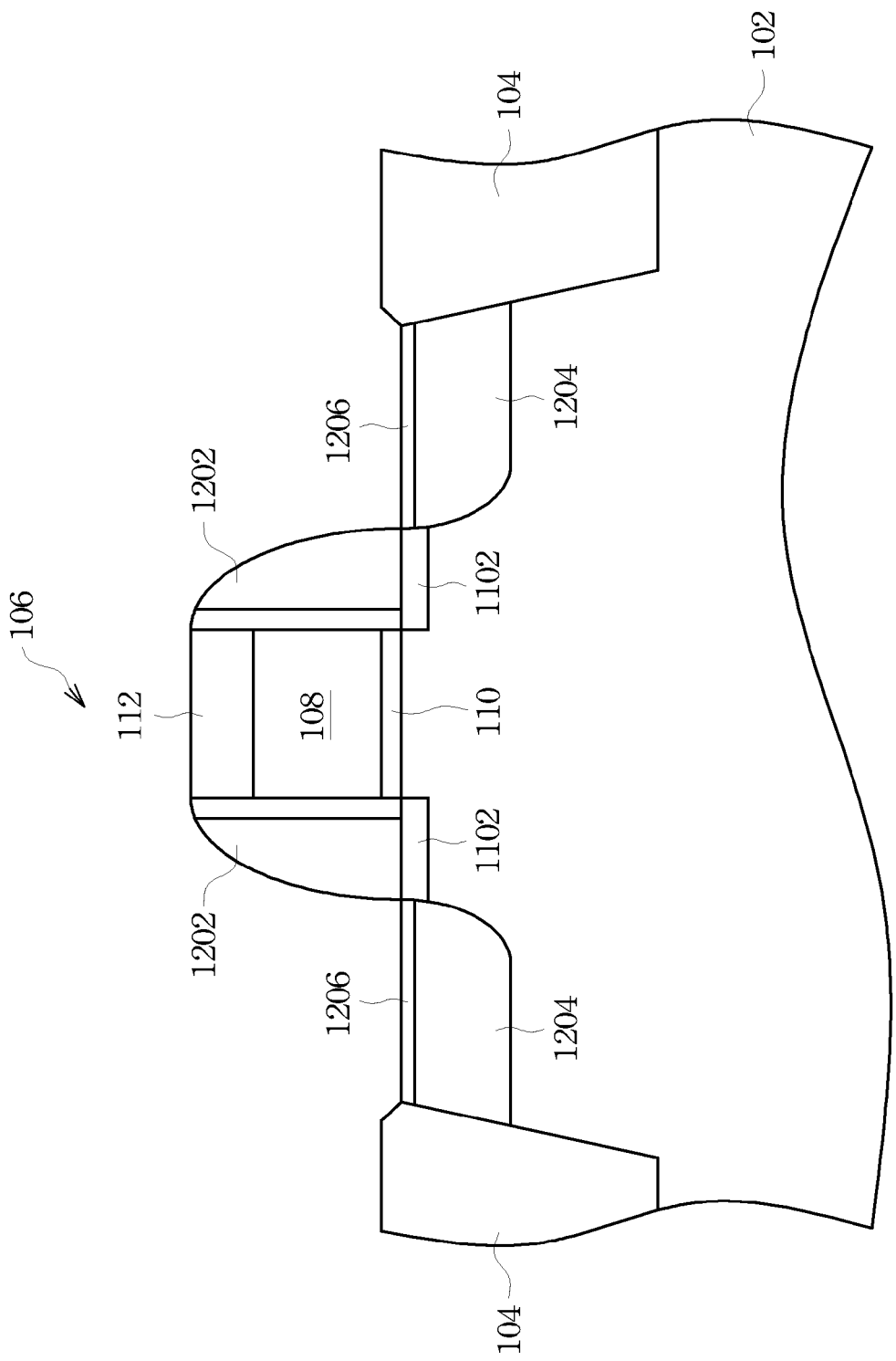

FIGS. 10-12 illustrate another method of forming a transistor having ultra-shallow junction extensions in accordance with another embodiment of the present invention. It should be noted that elements referenced using common reference numerals as those discussed above refer to like elements.

Referring now to FIG. 10, the substrate 102 is shown having the gate stack 106 formed thereon. In this embodiment, however, the source/drain regions 118 have not yet been formed. Rather, a liner 1002 is formed over the gate stack 106 to protect the gate stack from subsequent processes. The liner 1002 is preferably a substantially conformal oxide layer deposited over the substrate and removed from the surface of the substrate 102 in the source/drain regions. In an embodiment, the liner 1002 comprises an oxide, a nitrogen-containing layer, or the like, such as silicon dioxide, silicon nitride, silicon oxynitride, silicon oxide, or the like, formed by chemical vapor deposition, low-pressure CVD (LPCVD), or the like. In the preferred embodiment, the liners 1002 are about 20 Å to about 100 Å in thickness. The liner 1002 may be patterned using photolithography techniques.

It should be noted, however, that the thickness of the liners 1002 define the location of the USJs and the (optional) pocket implants as described in greater detail below. Accordingly, the thickness of the liner 1002 may be adjusted to position the USJ source/drain regions and the pocket implants at the desired locations.

As noted above, the pocket implants comprise a region having ions of the opposite conductivity type of the device being formed, e.g., n-type ions for a PMOSFET and p-type ions for NMOSFET. The pocket implants may be formed in a similar manner using similar materials as those described above.

After the liner 1002 is formed, an atomic layer 1004 is formed along the exposed surfaces of the substrate 102 in the source/drain regions. The atomic layer 1004 may be formed using similar materials and processes as those used to form the atomic layer 402 discussed above with reference to FIG. 4. An anneal may then be performed to form the USJ extensions 1102 as illustrated in FIG. 11. This process may be repeated multiple times.

Thereafter, as illustrated in FIG. 12, second spacers 1202, source/drain regions 1204, and silicide regions 1206 may be formed in accordance with an embodiment of the present invention. The second spacers 1202 may be formed using similar processes and materials as discussed above with reference to the second spacers 602 of FIG. 6. The second spacers 1202 are used to align source/drain regions 1204 along opposing sides of the gate stack 106, but offset a distance equal to the thickness of the second spacers 1202 from the gate stack 106. Optionally, the liner 1002 may be reformed on the surface of the substrate 102 prior to forming the second spacers 1202.

As discussed above, the source/drain regions 1204 may be formed by any suitable process, including implanting, in situ doping during an epitaxial growth, or the like. The source/drain regions 1204 may further comprise stressors and/or raised source/drains. Silicide regions 1206 may also be formed in a similar manner as described above. Standard processing techniques may be used to complete fabrication of the semiconductor device. For example, stress layers may be formed, inter-layer dielectrics may be formed, contacts and vias may be formed, metal lines may be fabricated, and the like.

Figure 13:
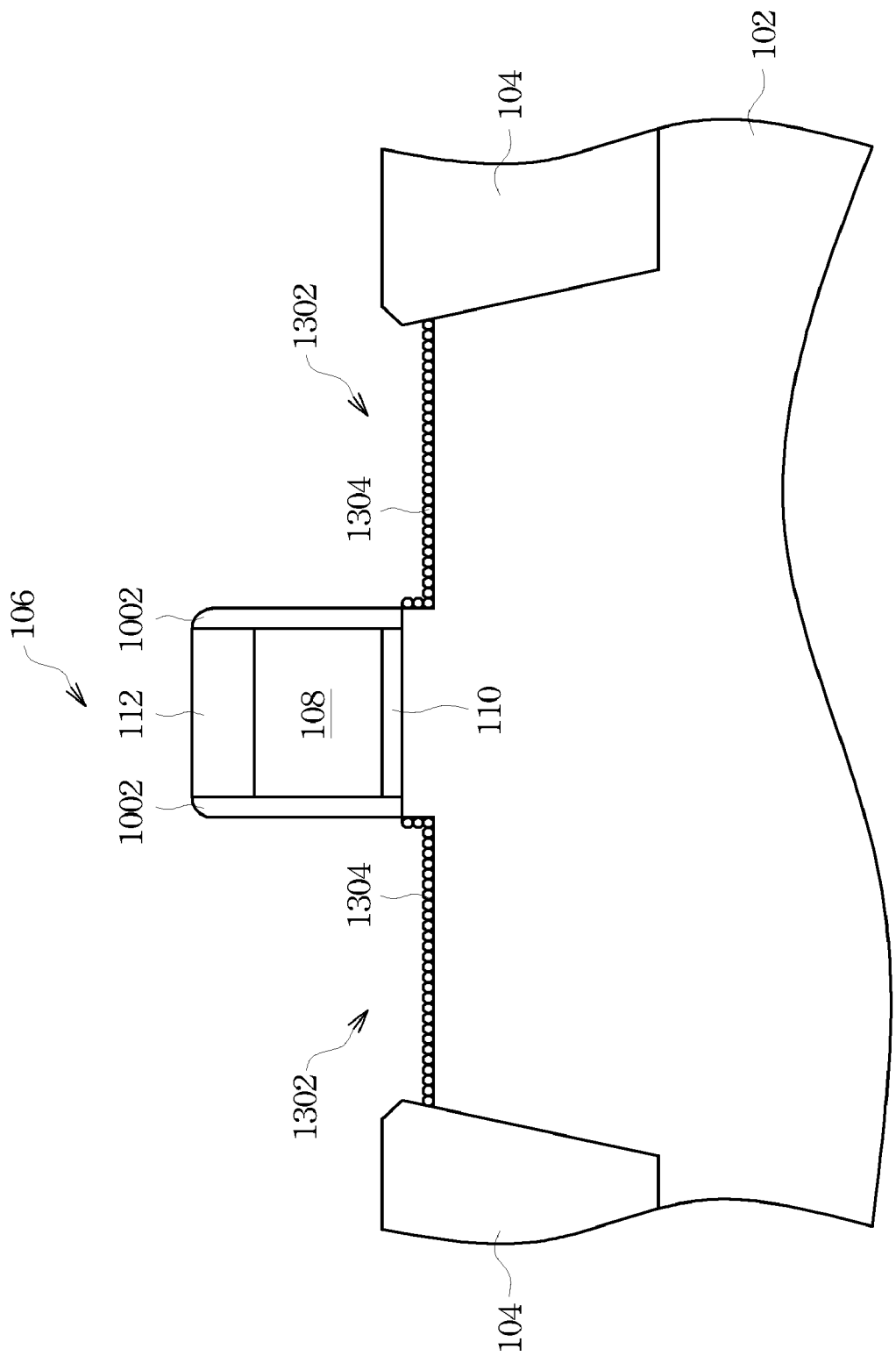
FIGS. 13-15 illustrate various intermediate process steps of yet another method of forming a semiconductor device.
Figure 14:
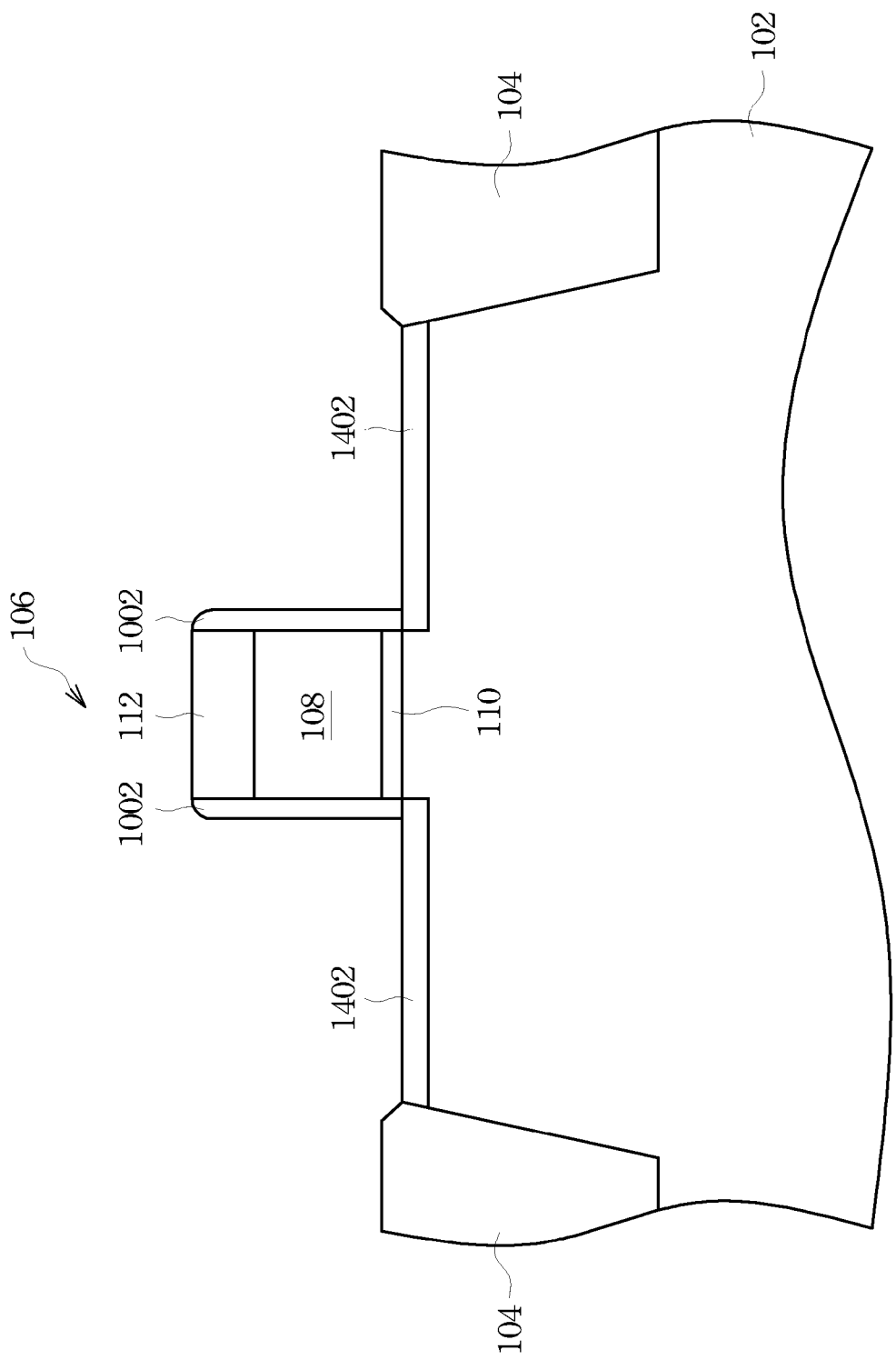

FIGS. 13-14 illustrate another method of forming a transistor having ultra-shallow junction extensions in accordance with yet another embodiment of the present invention. It should be noted that elements referenced to using common reference numerals as those discussed above refer to like elements.

Referring first to FIG. 13, the substrate 102 is shown having the gate stack 106, liner 1002 formed thereon, wherein like reference numerals refer to like elements with reference to FIG. 10. In this embodiment, the substrate 102 is recessed on opposing sides of the gate stack 106, thereby creating recesses 1302 in the source/drain regions. The recesses may be formed in the same manner as the recesses 702 discussed above with reference to FIG. 7 and preferably have a depth between about 1 nm to about 15 nm.

As noted above, the recesses 1302 create a vertical surface in the source/drain regions adjacent to the channel region, offset by the thickness of the liner 1002. An atomic layer 1304 is formed along the horizontal as well as vertical surfaces of the recesses 1302. The vertical surface allows greater lateral diffusion during the subsequent annealing process.

Optionally, pocket implants may also be formed in a similar manner as described above.

FIG. 14 illustrates the formation of the USJs 1402 in accordance with an embodiment of the present invention. After forming the atomic layer 1304, a subsequent anneal and epitaxial growth similar to that described above with reference to FIG. 8 may be used to form the USJs 1402. The processes may be repeated as necessary to create the desired depth and concentration for the USJs 1402. Preferably, the USJs 1402 extend under the liner 1002 to be aligned with or extend under the gate stack 106.

Figure 15:
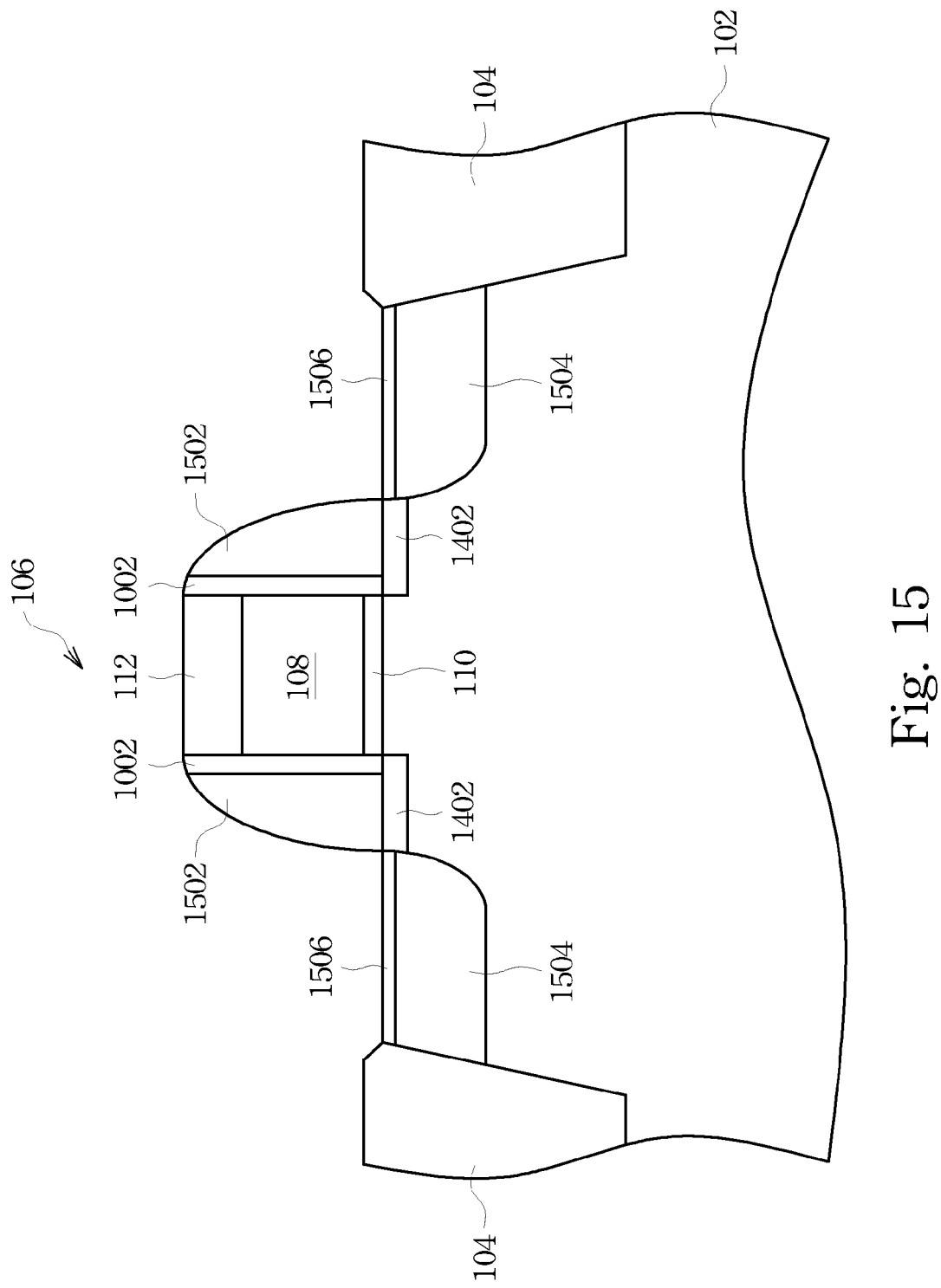

Thereafter, as illustrated in FIG. 15, second spacers 1502, source/drain regions 1504, and silicide regions 1506 may be formed in accordance with an embodiment of the present invention. The second spacers 1502 may be formed using similar processes and materials as discussed above with reference to the second spacers 602 of FIG. 6. The second spacers 1502 are used to align source/drain regions 1504 along opposing sides of the gate stack 106, but offset a distance equal to the thickness of the second spacers 602 from the gate stack 106. Optionally, the liner 1002 may be reformed on the surface of the substrate 102 prior to forming the second spacers 1502.

As discussed above, the source/drain regions 1504 may be formed by any suitable process, including implanting, in situ doping during an epitaxial growth, or the like. The source/drain regions may further comprise stressors and/or raised source/drains. Standard processing techniques may be used to complete fabrication of the semiconductor device. For example, stress layers may be formed, inter-layer dielectrics may be formed, contacts and vias may be formed, metal lines may be fabricated, and the like.

One of ordinary skill in the art will realize that while the above descriptions refer to the fabrication of a single transistor, other embodiments of the present invention may include fabricating multiple transistors on a single substrate, including a mixture of the PMOSFETs and NMOSFETs described above. Additional masking layers may be necessary to protect one or the other during certain process steps, such as implants, etching, atomic layer doping, etc.

In the foregoing specification, the invention has been described with reference to specific embodiments. However, various modifications and changes can be made by one skilled in the art without departing from the scope of the preferred embodiment. Accordingly, the specification and figures are to be regarded in an illustrative rather than a restrictive sense, and all such modifications are intended to be included within the scope of the preferred embodiment.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    providing a substrate having a gate stack formed thereon;
    forming heavily-doped source/drain regions in the substrate on opposing sides of the gate stack;
    forming an atomic layer of a dopant on a surface of the substrate on opposing sides of the gate stack while at least a portion of a sidewall of the gate stack is covered with a spacer, the atomic layer not extending completely over an upper surface of the heavily-doped source/drain regions, the dopant having a same type of conductivity as the heavily-doped source/drain regions; and
    annealing the substrate, thereby forming ultra-shallow junctions in the substrate on opposing sides of the gate stack.

2. The method of claim 1, further comprising, prior to forming the atomic layer, recessing the substrate on opposing sides of the gate stack, thereby forming recesses, and wherein the forming the atomic layer comprises forming the atomic layer in the recesses.

3. The method of claim 2, further comprising epitaxially growing an epitaxial layer in the recesses.

4. The method of claim 3, further comprising in situ doping the epitaxial layer.

5. The method of claim 3, further comprising repeatedly performing the forming the atomic layer, the annealing, and the epitaxially growing.

6. The method of claim 1, wherein the forming heavily-doped source/drain regions is performed prior to the forming the atomic layer.

7. The method of claim 1, further comprising forming a mask over the gate stack prior to the forming the atomic layer.

8. The method of claim 1, wherein the forming heavily-doped source/drain regions includes recessing the substrate thereby forming recesses and epitaxially growing a stressed layer in the recesses.

9. The method of claim 1, wherein the ultra-shallow junctions extend to the gate stack.

10. A method of forming a semiconductor device, the method comprising:
    providing a substrate having a gate stack formed thereon;
    recessing at least a portion of the substrate on opposing sides of the gate stack, thereby forming first recesses on opposing sides of the gate stack;
    forming an atomic layer along a bottom surface and a sidewall of the first recesses;
    annealing the substrate to diffuse the atomic layer, thereby forming source/drain extensions;
    epitaxially growing a first epitaxial layer in the first recesses; and
    forming source/drain regions on opposing sides of the gate stack, the first recesses extending closer to the gate stack than the source/drain regions.

11. The method of claim 10, further comprising in situ doping the first epitaxial layer.

12. The method of claim 10, wherein the forming the atomic layer, the annealing, and the epitaxially growing are performed a plurality of times.

13. The method of claim 10, wherein the forming source/drain regions is performed prior to the recessing.

14. The method of claim 10, wherein the forming source/drain regions comprise forming second recesses on opposing sides of the gate stack and epitaxially growing a second epitaxial layer in each of the second recesses.

15. A method of forming a semiconductor device, the method comprising:
   providing a substrate having a gate stack formed thereon;
   forming heavily-doped source/drain regions in the substrate on opposing sides of the gate stack;
   recessing the substrate on opposing sides of the gate stack, thereby forming recesses;
   forming an atomic layer of a dopant on a surface of the substrate on opposing sides of the gate stack, the atomic layer not extending completely over an upper surface of the heavily-doped source/drain regions, the dopant having a same type of conductivity as the heavily-doped source/drain regions, wherein the forming the atomic layer comprises forming the atomic layer in the recesses; and
   annealing the substrate, thereby forming ultra-shallow junctions in the substrate on opposing sides of the gate stack.

16. The method of claim 15, further comprising epitaxially growing an epitaxial layer in the recesses.

17. The method of claim 16, further comprising in situ doping the epitaxial layer.

18. The method of claim 16, further comprising repeatedly performing the forming the atomic layer, the annealing, and the epitaxially growing.

19. The method of claim 15, wherein the forming heavily-doped source/drain regions is performed prior to the forming the atomic layer.

20. The method of claim 15, further comprising forming a mask over the gate stack prior to the forming the atomic layer.

21. The method of claim 15, wherein the forming heavily-doped source/drain regions includes recessing the substrate thereby forming recesses and epitaxially growing a stressed layer in the recesses.

22. The method of claim 15, wherein the ultra-shallow junctions extend to the gate stack.

* * * * *